United States Patent [19]
Tokunaga et al.

[11] Patent Number: 5,304,820
[45] Date of Patent: Apr. 19, 1994

[54] PROCESS FOR PRODUCING COMPOUND SEMICONDUCTOR AND SEMICONDUCTOR DEVICE USING COMPOUND SEMICONDUCTOR OBTAINED BY SAME

[75] Inventors: Hiroyuki Tokunaga, Kawasaki; Kenji Yamagata; Takao Yonehara, both of Atsugi, all of Japan

[73] Assignee: Canon Kabushiki Kaisha, Tokyo, Japan

[21] Appl. No.: 851,238

[22] Filed: Mar. 13, 1992

Related U.S. Application Data

[60] Continuation of Ser. No. 515,327, Apr. 30, 1990, abandoned, which is a division of Ser. No. 174,511, Mar. 28, 1988, abandoned.

[30] Foreign Application Priority Data

Mar. 27, 1987 [JP] Japan .............................. 62-073522
Mar. 27, 1987 [JP] Japan .............................. 62-073523

[51] Int. Cl.⁵ ............................................. H01L 33/00
[52] U.S. Cl. ............................. 257/88; 257/93; 257/617; 257/653
[58] Field of Search ............... 357/60, 17; 257/88-93, 257/103, 614, 615, 617, 653

[56] References Cited

U.S. PATENT DOCUMENTS

| | | | |
|---|---|---|---|
| 3,433,684 | 3/1969 | Zanowick et al. | 357/4 X |
| 3,620,833 | 11/1971 | Gleim et al. | 357/60 X |
| 3,764,409 | 10/1973 | Nomura et al. | 437/90 |
| 3,885,061 | 5/1975 | Corboy et al. | 156/613 |
| 3,900,863 | 8/1975 | Kim | 357/17 |
| 3,911,431 | 10/1975 | Katsumura et al. | 257/88 |

(List continued on next page.)

FOREIGN PATENT DOCUMENTS

| | | |
|---|---|---|
| 1537549 | 7/1968 | European Pat. Off. . |
| 201933 | 11/1986 | European Pat. Off. . |
| 0240309 | 10/1987 | European Pat. Off. . |
| 0244081 | 11/1987 | European Pat. Off. . |
| 56-69798 | 4/1983 | Japan . |
| 0028327 | 2/1984 | Japan .................. 437/83 |
| 59-69495 | 4/1984 | Japan . |
| 0180751 | 5/1986 | Japan . |
| 2011953 | 7/1979 | United Kingdom . |
| 1131153 | 10/1988 | United Kingdom . |

OTHER PUBLICATIONS

Blum, J. M. et al. "Integrated Multicolor Light-Emitting Diode Array" IBM Tech. Disc. Bull., Jul. 1972, pp. 445-446.

(List continued on next page.)

*Primary Examiner*—Sara W. Crane
*Attorney, Agent, or Firm*—Fitzpatrick, Cella, Harper & Scinto

[57] ABSTRACT

A process for producing a compound semiconductor comprises applying a crystal forming treatment on a substrate having a free surface comprising a nonnucleation surface ($S_{NDS}$) with smaller nucleation density and a nucleation surface ($S_{NDL}$) arranged adjacent thereto having a sufficiently small area for a crystal to grow only from a single nucleus and a larger nucleation density ($ND_L$) than the nucleation density ($ND_S$) of said nonnucleation surface ($S_{NDS}$), by exposing the substrate to either of the gas phases:

(a) gas phase (a) containing a starting material (II) for feeding the group II atoms of the periodic table and a starting material (VI) for feeding the group VI atoms of the periodic table and (b) gas phase (b) containing a starting material (III) for feeding the group III atoms of the periodic table and a starting material (V) for feeding the group V atoms of the periodic table, thereby forming only a single nucleus on said nucleation surface pound semiconductor to grow from said single nucleus, characterized in that a semiconductor junction is formed in said monocrystal by feeding a starting material (Dn) for feeding a dopant for controlling to one electroconduction type and a starting material (Dp) for feeding a dopant for controlling to the electroconduction type opposite to said electroconduction type with change-over to one another into said gas phase, during said crystal forming treatment.

4 Claims, 16 Drawing Sheets

U.S. PATENT DOCUMENTS

| | | | |
|---|---|---|---|
| 4,007,396 | 2/1977 | Wisbey et al. | 257/88 |
| 4,131,496 | 12/1978 | Weitzel et al. | 156/612 |
| 4,174,422 | 11/1979 | Matthews et al. | 156/610 |
| 4,239,788 | 12/1980 | Beck | 427/43.1 |
| 4,279,688 | 7/1981 | Abrahams et al. | 156/613 |
| 4,467,521 | 8/1984 | Spooner et al. | 156/612 |
| 4,470,192 | 9/1984 | Miller | 156/612 |
| 4,479,847 | 10/1984 | McCaldin et al. | 437/90 |
| 4,530,149 | 7/1985 | Jastrzebski et al. | 437/90 |
| 4,549,926 | 10/1985 | Corboy et al. | 156/612 |
| 4,551,394 | 11/1985 | Betsch et al. | 437/90 |
| 4,587,717 | 5/1986 | Daniele et al. | 437/90 |
| 4,591,889 | 5/1986 | Gossard et al. | 357/17 |
| 4,657,603 | 4/1987 | Kruehler et al. | 148/175 |
| 4,670,088 | 6/1987 | Tsaur et al. | 437/89 |
| 4,914,495 | 4/1990 | Norton et al. | 357/32 |

OTHER PUBLICATIONS

L. Ruge, Halbleiter Technologie, Berlin (1984) pp. 74–55.

Chen et al. "Embedded Epitaxial Growth of Lasers", Appl. Phys. Lett. 38(5), Mar. 1981.

"Single-crystal Films of Silicon on Insulators", Filby, J. D. et al., Brit. J. Appl. Phys. 18; 1357–82 (1967).

"Non-Planar VPE Growth of Low-Threshold (>60MA) Current 1.3 $\mu$m CW Lasers", Olsen G. H. et al., IEDM Techn. Digest, pp. 798–800 (Dec. 1982).

"Structure of Cadmium Layers Vapor-Deposited on Muscovite," P. Dobbert et al., Kristall und Technik, vol. 8, No. 7, 1973, 853–857 (Original and Translation).

PROCESS FOR PRODUCING COMPOUND SEMICONDUCTOR AND SEMICONDUCTOR DEVICE USING COMPOUND SEMICONDUCTOR OBTAINED BY SAME

This application is a continuation of application Ser. No. 07/515,327 filed Apr. 30, 1990, now abandoned, which in turn, is a division of application Ser. No. 07/174,511, filed Mar. 28, 1988, now abandoned.

BACKGROUND OF THE INVENTION

1. Field of the Invention

This invention relates to a process for producing a compound semiconductor having a desired conduction type region and a semiconductor device obtained by using the same.

2. Related Background Art

In the prior art, for formation of pn junction in compound semiconductors, the liquid phase growth method, the MOCVD method, the MBE method have been practiced. Among them, the liquid phase growth method has been primarily practiced, and therefore description thereof is set forth below by referring to an example.

Liquid phase growth utilizes slow-cooled epitaxial growth, namely difference in the conduction type layers deposited due to difference in temperature.

FIG. 18A shows the carrier concentration distribution near the pn junction of a compound semiconductor formed by the above prior art method. FIG. 18B shows the change in carrier concentration corresponding to the relationship between solution temperature and time. Initially, when the solution temperature is $T_1$, the region near the substrate is a conductive layer having a high carrier concentration of n-type, and n-type carrier concentration is reduced as the temperature is lowered. And, at the point of the temperature of $T_2$, the n-p reversal temperature is reached and pn junction is formed. When slow cooling is further continued, p-type layer will grow while becoming higher concentration, until growth is completed at the temperature $T_3$ by departing the substrate from the solution.

When growth is performed by use of this method, as is apparent from FIG. 18A, the carrier concentration near the pn junction becomes lower, whereby there is the problem that when a device is formed, its response speed becomes delayed.

Also, although it is possible to grow similarly a compound semiconductor crystal by the MOCVD method or the MBE method as previously mentioned, the above methods have not yet been technically established, and cannot be said to be sufficiently reliable.

Further, since the crystal growth by use of the three kinds of methods as mentioned above is epitaxial growth, there is the drawback that an expensive compound semiconductor substrate such as GaAs, etc. must be used as the substrate.

Besides, as to the structures of grown layers, in all of the prior art examples, the pn junction faces will become in parallel to the substrate surface.

SUMMARY OF THE INVENTION

The present invention has been accomplished in view of the above points, and its primary object is to provide a process for producing a compound semiconductor which has solved the problems as described above of the prior art.

Another object of the present invention is to provide a process for producing a novel compound semiconductor which can produce a compound semiconductor easily and with good reproducibility and bulk productivity.

Still another object of the present invention is to provide a process for producing a compound semiconductor which can provide a compound semiconductor capable of forming a semiconductor electronic device improved in response speed with good reliability.

Yet another object of the present invention is to provide a process for producing a compound semiconductor, which comprises applying a crystal forming treatment on a substrate having a free surface comprising a nonnucleation surface ($S_{NDS}$) with a smaller nucleation density and a nucleation surface ($S_{NDL}$) arranged adjacent thereto having a sufficiently small area for a crystal to grow only from a single nucleus and a larger nucleation density ($ND_L$) than the nucleation density ($ND_S$) of said nonnucleation surface ($S_{NDS}$), by exposing the substrate to either of the gas phases:

(a) gas phase (a) containing a starting material (II) for feeding the group II atoms of the periodic table and a starting material (VI) for feeding the group VI atoms of the periodic table and (b) gas phase (b) containing a starting material (III) for feeding the group III atoms of the periodic table and a starting material (V) for feeding the group V atoms of the periodic table, thereby forming only a single nucleus on said nucleation surface ($S_{NDL}$) and permitting a monocrystal of the compound semiconductor to grow from said single nucleus, characterized in that a semiconductor junction is formed in said monocrystal by feeding a starting material (Dn) for feeding a dopant for controlling to one electroconduction type and a starting material (Dp) for feeding a dopant for controlling to the electroconduction type opposite to said electroconduction type with change-over to one another into said gas phase, during said crystal forming treatment.

Yet still another object of the present invention is to provide a process for producing a compound semiconductor, which comprises applying a crystal forming treatment on a substrate having a free surface comprising a nonnucleation surface ($S_{NDS}$) with a smaller nucleation density and a nucleation surface ($S_{NDL}$) arranged adjacent thereto having a sufficiently small area for a crystal to grow only from a single nucleus and a larger nucleation density ($ND_L$) than the nucleation density ($ND_S$) of said nonnucleation surface ($S_{NDS}$), by exposing the substrate to either of the gas phases:

(a) gas phase (a) containing a starting material (II) for feeding the group II atoms of the periodic table and a starting material (VI) for feeding the group VI atoms of the periodic table and (b) gas phase (b) containing a starting material (III) for feeding the group III atoms of the periodic table and a starting material (V) for feeding the group V atoms of the periodic table, thereby forming only a single nucleus on said nucleation surface ($S_{NDL}$) and permitting a monocrystal of the compound semiconductor to grow from said single nucleus, characterized in that a semiconductor junction is formed in said monocrystal by feeding a starting material (Dn) for feeding a dopant for controlling to one electroconduction type while changing the introduced amount of said starting material (Dn) with the lapse of time.

Again another object of the present invention is to provide a semiconductor device by use of the compound semiconductor obtained by the above production process.

DESCRIPTION OF THE PREFERRED EMBODIMENTS

In the present invention, a desired conduction type region is formed by changing the growth conditions during crystal growth of a compound semiconductor on the nucleation surface ($S_{NDL}$) by utilizing nucleation density difference ($\Delta ND$).

First, for better understanding of the present invention, as the related basic technology, general thin film forming process of a metal or a semiconductor is to be explained.

When the deposition surface (crystal growth surface) is of a material different in kind from the depositing atoms, particularly an amorphous material, the depositing atoms will be freely diffused on the substrate surface and reevaporated (eliminated). And, as the result of collision mutually between the atoms, a nucleus is formed, and when the nucleus reaches the size rc ($=-2\sigma_o/gv$) or more at which its free energy G becomes the maximum (critical nucleus), G is reduced and the nucleus continues to grow stably three-dimensionally and become shaped in an island. The nucleus with a size exceeding rc is called "stable nucleus" and in the basic description of the present invention hereinbelow, "nucleus" unless otherwise specifically noted indicates the "stable nucleus".

Also, of the "stable nucleus", one with small r is called "initial nucleus". The free energy G formed by formation of the nucleus is represented by:

$$G = 4\pi f(\theta)(\sigma_o r^2 + \tfrac{1}{3} gv \cdot r^3)$$

$$f(\theta) = \tfrac{1}{4}(2 - 3\cos\theta + \cos^2\theta)$$

where r: radius of curvature of nucleus
θ: contact angle of nucleus
gv: free energy per unit volume
$\sigma_o$: surface energy between nucleus and vacuum.

Figure 1:
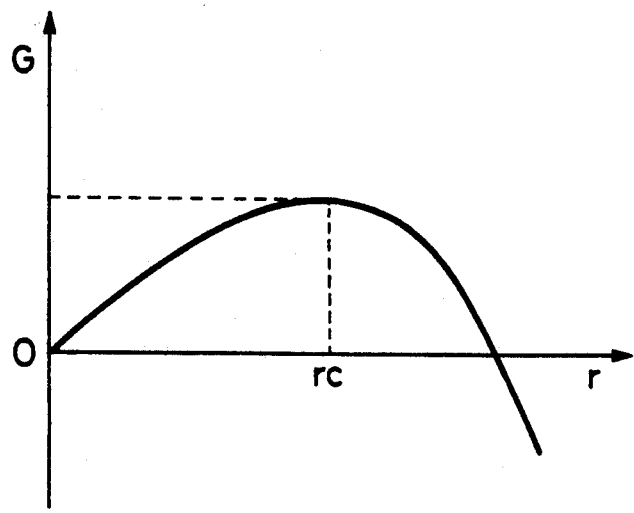
FIG. 1 illustrates the relationship between the size of the nucleus $r_c$ and the free energy G.

The manner in which G is changed is shown in FIG. 1. In the same Figure, the curvature of radius of the stable nucleus when G is at the maximum value is rc.

Thus, the nucleus grows to become shaped in an island, and further grows until contact mutually between islands proceeds, giving rise to coalescence in some cases, finally forming via a network structure a continuous film to cover completely the substrate surface. Through such process, a thin film is deposited on the substrate.

In the deposition process as described above, the density of the nucleus formed per unit area of the substrate surface, the size of the nucleus and the nucleation speed are determined depending on the state of the system of deposition, and particularly the interaction between the depositing atoms and the substrate surface substance is an important factor. Also, a specific crystal direction grows in parallel to the substrate depending on the anisotropy relative to the crystal face of the interfacial energy at the interface between the deposited substance and the substrate, and when the substrate is amorphous, the crystal directions within the substrate plane are not constant. For this reason, a grain boundary is formed by collision mutually between nuclei or islands. Particularly, in case of collision mutually between islands with certain sizes or greater, coalescence will occur, leading directly to formation of a grain boundary. The grain boundary formed can be migrated with difficulty in the solid phase, and therefore the grain size is determined at that point.

Next, the selective deposition film forming method for forming selectively a deposited film on the deposition surface is to be described. The selective deposition film forming method is a method in which a thin film is selectively formed on the substrate by utilizing the difference between the materials in the factors influencing nucleation in the thin film forming process such as surface energy, attachment coefficient, elimination coefficient, surface diffusion speed, etc.

Figure 2A:
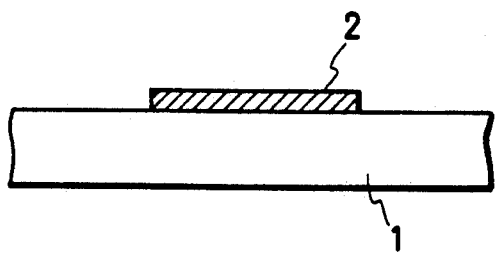
FIGS. 2A and 2B illustrate schematically the selective deposition method.
Figure 2B:
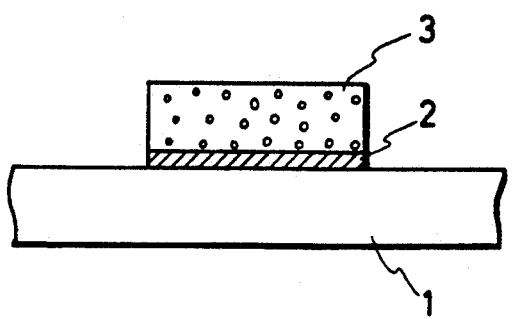

FIGS. 2A and 2B illustrate schematically the selective deposition film forming method. First, as shown in FIG. 2A, on the substrate 1, a thin film 2 comprising a material different in the above factors from the substrate 1 is formed at a desired portion on the substrate 1. And, when deposition of a thin film comprising an appropriate material is performed according to appropriate deposition conditions, it becomes possible to cause a phenomenon to occur such that the thin film 3 will grow only on the free surface of the thin film 2 without growth on the free surface of the substrate 1. By utilizing this phenomenon, the thin film 3 which is self-aligning can be permitted to grow, whereby the lithographic step by use of a resist as practiced in the prior art can be omitted.

As the materials which can be deposited by such selective deposition film forming method, there may be included, for example, $SiO_2$ as the substrate 1, Si, GaAs, silicon nitride as the thin film 2, and Si, W, GaAs, InP, etc. as the thin film 3 to be deposited.

The II-VI group compound crystal can be grown on a Si substrate, or a II-VI group compound substrate, and cannot be grown on $SiO_2$ substrate as is known in the art. However, by implanting ions of the group III elements (atoms), the group V elements (atoms), or ions of the group II elements (atoms), the group VI elements (atoms) of the periodic table on a $SiO_2$ substrate, the nucleation density (ND) at the ion implanted portion can be enhanced to make the difference ($\Delta ND$) in nucleation density from the $SiO_2$ substrate sufficiently large, whereby selective deposition of the group II-VI compound can be effected.

The III-V group compound crystal can be grown on a Si substrate, a III-V group compound substrate, and cannot be grown on $SiO_2$ 2 substrate as is known in the art. However, by implanting ions of the group III elements (atoms), the group V elements (atoms), or ions of the group II elements (atoms), the group VI elements (atoms) of the periodic table on a $SiO_2$ substrate, the nucleation density (ND) at the ion implanted portion can be enhanced to make the difference ($\Delta ND$) in nucleation density from $SiO_2$ substrate sufficiently large, whereby selective deposition of the group III-V compound can be effected.

Also, it is possible to add a different material having larger nucleation density ($ND_L$) to the material surface having smaller nucleation density ($ND_S$) such as $SiO_2$ substrate and form selectively a deposited film by utilizing the nucleation density difference ($\Delta ND$).

The present invention utilizes the selective deposition method based on such nucleation density difference ($\Delta ND$), and a nucleation surface comprising a material which has sufficiently larger nucleation density than the material forming the deposition surface (crystal formation surface) and is different from the latter material is formed sufficiently finely so that only a single nucleus may grow, whereby a single crystal is grown selectively only from such a fine nucleation surface.

Since the selective growth of single crystal is determined depending on the electron state of the nucleation surface, particularly the state of dangling bond, the material with lower nucleation density for forming the nucleation surface (e.g. $SiO_2$) is not required to be a bulk material, but the nucleation surface may be formed on the surface of any desired material substrate.

Next, the outline of the process for forming crystals according to the present invention is described in detail by referring to the drawings.

Figure 3A:
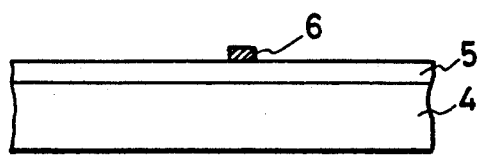
FIGS. 3A-3D illustrate diagrammatically the steps of a first example of the formation process for crystals according to the present invention.
Figure 3B:
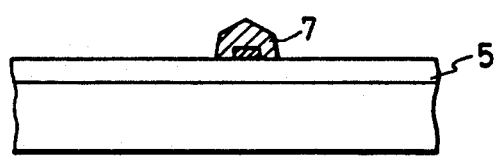
Figure 3C:
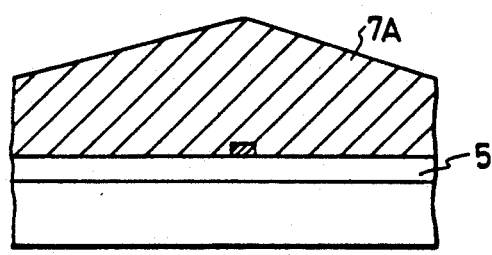
Figure 3D:
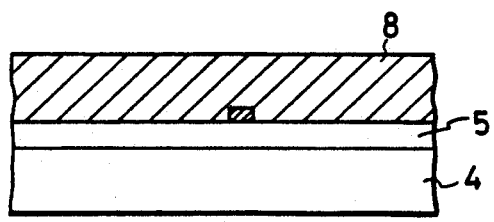
Figure 4A:
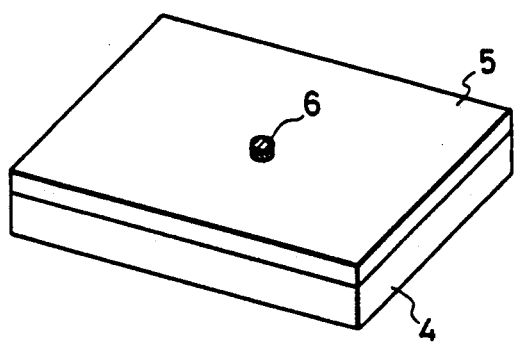
FIGS. 4A and 4B are perspective views in FIGS. 3A and 3D.
Figure 4B:
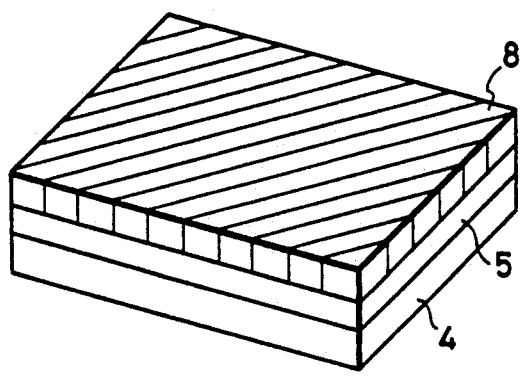
Figure 5A:
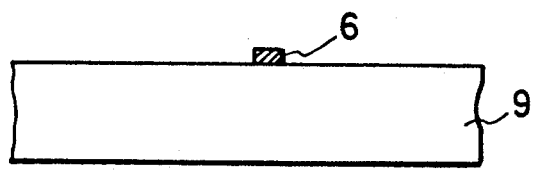
FIGS. 5A-5D are diagrams of the formation steps of the crystal showing a second example of the crystal forming process of the present invention.
Figure 5B:
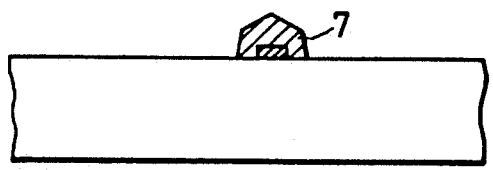
Figure 5C:
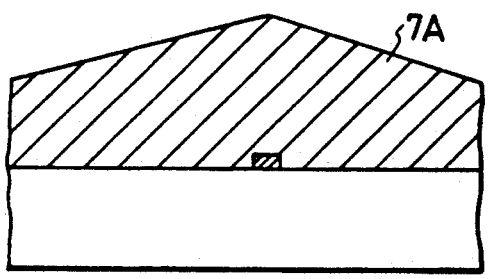
Figure 5D:
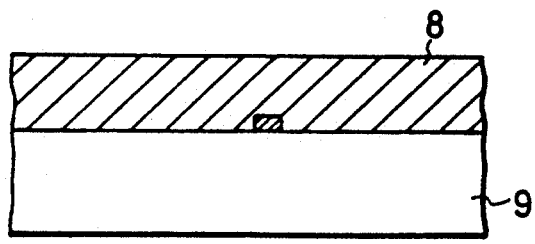

FIGS. 3A-3D illustrate diagrammatically the steps of a first example of the formation process for crystals according to the present invention, and FIGS. 4A and 4B are perspective views in FIGS. 3A and 3D.

First, as shown in FIG. 3A and FIG. 4A, on the substrate 4 comprising high melting point glass, quartz, alumina, ceramics, etc., a thin film 5 with small nucleation density enabling selective nucleation (nonnucleation surface ($S_{NDS}$)] is formed, and a material different from the material forming the thin film 5 with small nucleation density is thinly deposited thereon, followed by patterning by lithography, etc. to form sufficiently finely a nucleation surface comprising a different material ($S_{NDL}$) (or called "Seed") 6, thus obtaining a substrate for crystal formation. However, the size, the crystal structure and the composition of the substrate 4 may be as desired, and it may be also a substrate having a functional device previously formed thereon by the conventional semiconductor technique. Also, the nucleation surface ($S_{NDL}$) 6 comprising a different material is, as described above, inclusive of Se, As modified regions formed by ion implantation on the thin film 5. The nucleation surface is the surface on which substantially only single nucleus is formed and is constituted of an amorphous material.

Next, by selecting appropriate deposition conditions, a monocrystal of a thin film material is formed only on the nucleation surface ($S_{NDL}$) 6. That is, the nucleation surface ($S_{NDL}$) 6 is required to be formed sufficiently finely to the extent that only a single nucleus may be formed. The size of the nucleation surface ($S_{NDL}$) 6, which depends on the kind of the material, may be several microns or less. Further, the nucleus grows while maintaining a single crystal structure to become a single crystal grain 7 shaped in an island as shown in FIG. 3B. For the island-shaped single crystal grain 7 to be formed, it is desirable to determine the conditions for crystal forming treatment so that no nucleation may occur at all on the free surface of the thin film 5.

The island-shaped monocrystalline grain 7 further grows while maintaining the monocrystalline structure with the nucleation surface ($S_{NDL}$) 6 as the center (lateral overgrowth), whereby the thin film 5 can be partially or wholly covered therewith as shown in FIG. 3C (monocrystal 7A).

Subsequently, the surface of the monocrystal 7A is flattened by etching or polishing to form a monocrystal layer 8 on the thin film 5, on which a desired device can be formed, as shown in FIG. 3D and FIG. 4B.

Thus, since the thin film 5 constituting the nonnucleation surface ($S_{NDS}$) is formed on the substrate 4, any desired material can be used for the substrate 4 which is the supporting member. Further, in such a case, even if the substrate 4 may be one having a functional device, etc. formed by the conventional semiconductor technique, a monocrystalline layer 8 can be easily formed thereon.

In the above example, the nonnucleation surface ($S_{NDS}$) was formed with the thin film 5, but of course as shown in FIGS. 5A-5D a substrate comprising a material with small nucleation density (ND) enabling selective nucleation may be used as such, and the monocrystalline layer may be formed similarly with provision of the nucleation surface ($S_{NDL}$) at any desired position.

FIGS. 5A-5D are diagrams of the formation steps of the crystal showing a second example of the crystal forming process according to the present invention. As shown in FIGS. 5A-5D, by forming a nucleation surface ($S_{NDL}$) 6 comprising a material with larger nucleation density (ND) sufficiently finely on a substrate 9 comprising a material with a smaller nucleation density (ND) enabling selective nucleation, to provide a substrate for crystal formation and a monocrystalline layer 8 can be formed on said substrate similarly as in the first example.

Figure 6A:
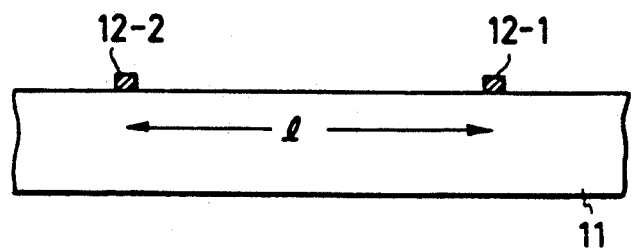
FIGS. 6A-6D are diagrams of the formation steps showing a third example of the process for forming the crystal of the present invention.
Figure 6B:
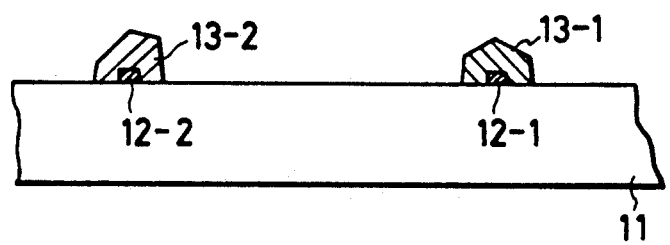
Figure 6C:
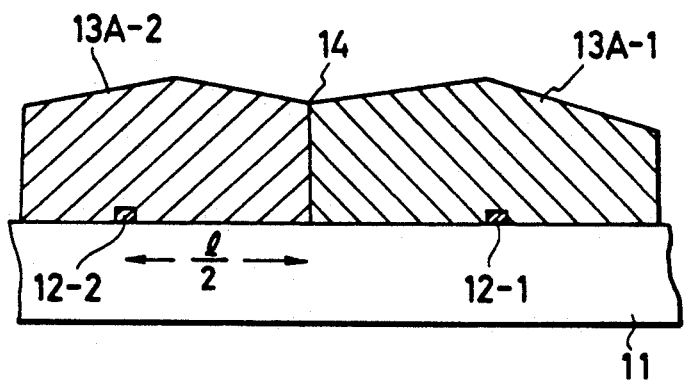
Figure 6D:
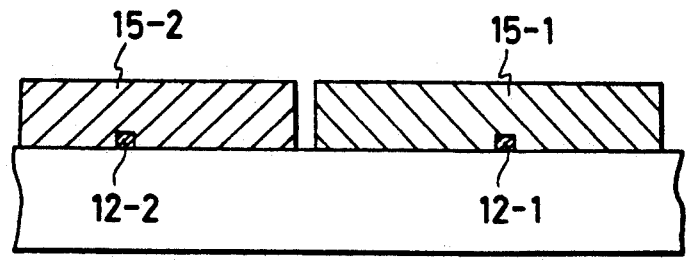
Figure 7A:
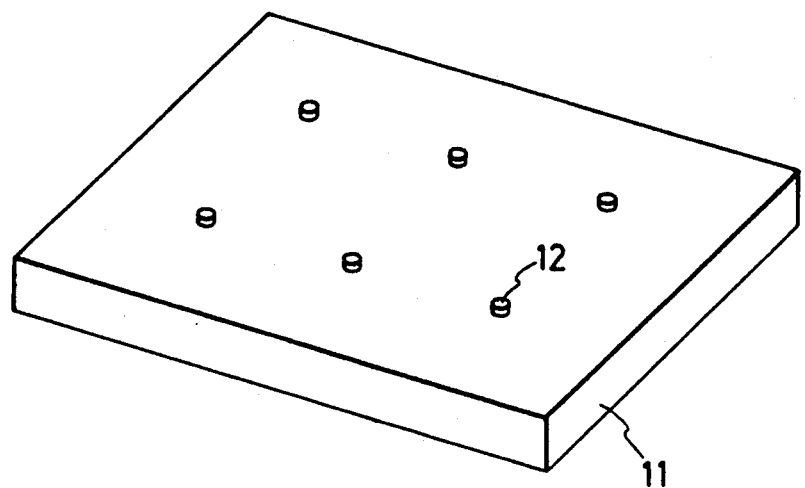
FIGS. 7A and 7B are perspective views of FIGS. 6A and 6D.
Figure 7B:
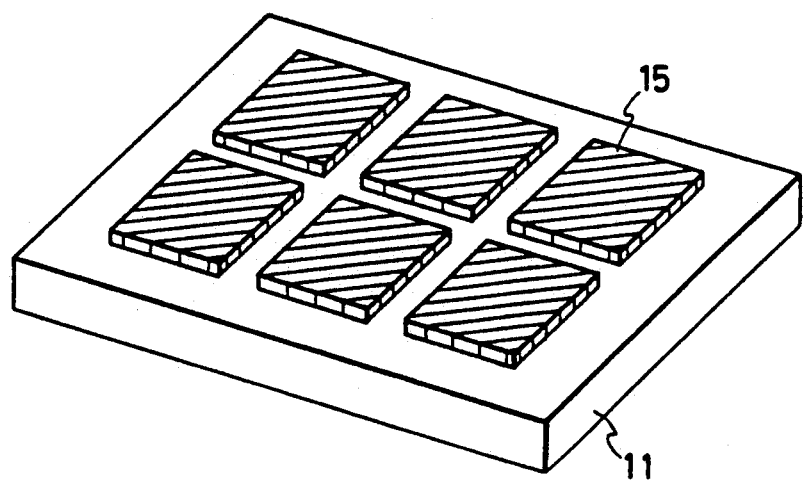

FIGS. 6A-6D are diagrams of the formation steps showing a third example of the process for forming the crystal according to the present invention, and FIGS. 7A and 7B are perspective views of FIGS. 6A and 6D.

As shown in FIG. 6A and FIG. 7A, on an amorphous insulating material substrate 11, nucleation surfaces ($S_{NDL}$) 12-1, 12-2 are arranged sufficiently small with a material different from the above substrate 11 with a distance Q therebetween. The distance 1 may be set equal to the size of the single crystal region required for formation of, for example, a semiconductor device or a group of devices or greater than that.

Next, by selecting appropriate crystal forming conditions, only one nucleus of the crystal forming material is formed on only the nucleation surfaces ($S_{NDL}$) 12-1, 12-2. That is, the nucleation surfaces ($S_{NDL}$) 12-1, 12-2 are required to be formed to sufficiently fine sizes (areas) to the extent that only a single nucleus may be formed. The sizes of the nucleation surfaces ($S_{NDL}$) 12-1, 12-2, which may differ depending on the kind of the material, may be preferably 10 μm or less, more preferably 5 μm or less, optimally 1 μm or less. Further, the nucleus grows while maintaining a monocrystalline structure to become island-shaped single crystal grains 13-1, 13-2 as shown in FIG. 6B. For island-shaped monocrystal grains 13-1, 13-2 to be formed, as already mentioned, it is desirable to determine the conditions for crystal forming treatment so that no nucleation will occur at all on other surfaces than the nucleation surfaces ($S_{NDL}$) on the substrate 11.

The crystal orientations of the island-shaped single crystal grains 13-1, 13-2 in the normal direction of the substrate 11 are constantly determined such that the interface energy of the material is made minimum. For, the surface or the interface energy has anisotropy depending on the crystal face. However, as already mentioned, the crystal orientation within the substrate plane in an amorphous substrate cannot be determined.

The island-shaped monocrystalline grains 13-1, 13-2 further grow to become monocrystals 13A-1, 13A-2, whereby adjoining monocrystals 13A-YA 13A-2 contact mutually each other as shown in FIG. 6C, but since the crystal orientation within the substrate plane is not constant, a crystal grain boundary 14 is formed in the middle portion between the nucleation surfaces ($S_{NDL}$) 12-1 and 12-2.

Subsequently, single crystals 13A-1, 13A-2 grow three-dimensionally, but the crystal face with slower growth speed will appear as the facet. For this reason, flattening of the surfaces of monocrystals 13A-1, 13A-2 is performed by etching or polishing, and further the portion of the grain boundary 14 is removed, to form the thin films 15-1, 15-2, 15 of single crystals containing no grain boundary in shape of lattice as shown in FIG. 6D and FIG. 7B. The sizes of the monocrystalline thin films 15-1, 15-2, 15 are determined by the distance Q between the nucleation surfaces ($S_{NDL}$) 12 as described above. That is, by defining appropriately the formation pattern of the nucleation surfaces ($S_{NDL}$) 12, the position of the grain boundary can be controlled to form monocrystals with desired sizes at a desired arrangement.

The present invention utilizes the crystal formation process as described above by referring to FIG. 3A to FIG. 7B by way of example.

In the present invention, in the above crystal formation process, crystal forming treatment is performed in gas phase, and either one of:

(a) gas phase (a) containing a starting material (II) for feeding the group II atoms of the periodic table and a starting material (VI) for feeding the group VI atoms of the periodic table and (b) gas phase (b) containing a starting material (III) for feeding the group III atoms of the periodic table and a starting material (V) for feeding the group V atoms of the periodic table, is selected as the gas phase, and a semiconductor junction is formed in the crystal of the compound semiconductor formed by feeding into the selected gas phase a starting material (D) for feeding a dopant to control the conduction type as mentioned in the semiconductor field thereof with change-over of their kind corresponding to the kind of conduction type.

The typical crystal of the compound semiconductor obtained in the process for producing the compound semiconductor of the present invention is the so-called II-VI group compound semiconductor crystal and the III-V group compound semiconductor crystal.

As the respective starting materials to be used in the production process of the present invention, there may be included specifically the following compounds as suitable examples.

As the starting material (II) for feeding the group II atoms of the periodic table (abbreviated as "the group II atoms"), for necessity to be fed into gas phase, those which are under gaseous state or readily gasifiable are preferred.

These points can be said to be applicable similarly to the starting material (VI) for feeding the group VI atoms of the periodic table (abbreviated as "the group VI atoms"), the starting material (III) for feeding the group III atoms of the periodic table (abbreviated as "the group III atoms"), the starting material (V) for feeding the group V atoms of the periodic table (abbreviated as "the group V atoms") and the starting material (D) for feeding dopant.

As the starting material (II), there may be included dimethyl zinc, diethyl zinc ($Zn(C_2H_5)_2$), dimethyl cadmium ($Cd(CH_3)_2$), diethyl cadmium, dipropyl cadmium ($Cd(C_3H_7)_2$), dibutyl cadmium ($Cd(C_4H_9)_2$), dimethyl mercury ($Hg(CH_3)_2$), diethyl mercury ($Hg(C_2H_5)_2$), etc., and as the starting material (VI) hydrogen sulfide ($H_2S$), selenium hydride, dimethyl selenium, diethyl selenium ($Se(C_2H_5)_2$), dimethyl diselenide ($CH_3SeCH_3$), dimethyl tellurium ($Te(CH_3)_2$), diethyl tellurium ($Te(C_2H_5)_2$), etc. By combination of these starting materials (II) and (VI), monocrystals of II-VI group compound semiconductors such as ZnS, ZnTe, CdS, CdTe, HgSe, ZnO, etc. and mixed crystal compound monocrystals of these can be selectively formed on the nucleation surface ($S_{NDL}$).

In the case of obtaining III-V group compound semiconductor crystals, by use of trimethyl indium $In(CH_3)_3$ as the starting material (III) and phosphine $PH_3$ as the starting material (V), InP monocrystals can be formed selectively on an amorphous substrate, and also AlSb monocrystals by use of trimethyl aluminum $Al(CH_3)_3$ as the starting material (III) and stibine $SbH_3$ as the starting material (V). By combination of the respective starting materials as described above, monocrystals of either one of GaP, GaSb, InAs, InSb, AlAs and AlP can be selectively grown, and further any desired combination of mixed crystal III-V group compound monocrystals can be selectively grown.

As the starting materials (III), the above compounds having methyl group are not limitative, but it is also possible to use compounds having ethyl group, propyl group, butyl group, isobutyl group such as triethyl gallium Ga(C$_2$H$_5$)$_3$, tripropyl indium In(C$_3$H$_7$)$_3$, tributyl gallium Ga(C$_4$H$_9$)$_3$, triisobutyl aluminum Al(CH$_3$)$_2$CHCH$_2$, etc.

First embodiment

FIGS. 8A–8E illustrate a first embodiment of the present invention.

Figure 8A:
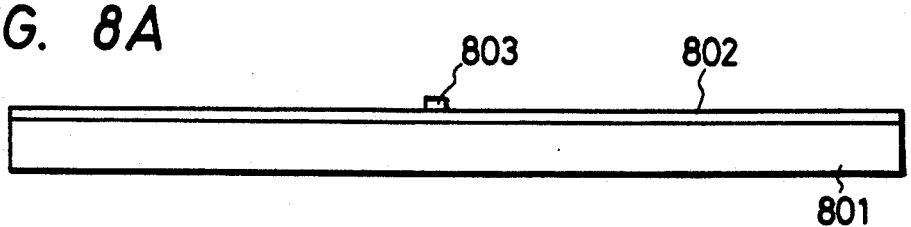
FIGS. 8A-8E are diagrams of the formation steps of the crystal showing a first embodiment of the present invention.

First, a nonnucleation surface 802 is formed on a substrate 801. Next, a nucleation surface 803 is formed sufficiently finely so that a single nucleus may be formed. This size may be preferably 10 μm or less, more preferably 5 μm or less, as described above. Optimally it is 1 μm or less. The materials for forming such nonnucleation surface 802 and nucleation surface 803 may differ depending on the crystalline material constituting the monocrystals to be formed. In the case of forming monocrystals of GaAs, an amorphous material such as silicon nitride, aluminum oxide etc. may be used as the material for forming the nucleation surface 803, and silicon oxide, etc. may be used as the material for forming the nonnucleation surface 802. Also, as shown in FIG. 8A, without formation of a film on the substrate 801, for example, As ions may be implanted into the SiO$_2$ film in an excessive amount, and the modified region thus formed may be used as the nucleation surface 803. In the case of producing a II-VI group compound semiconductor such as ZnS, ZnSe, CdSe, etc., silicon oxide, etc. may be used as the material for forming the nonnucleation surface 802, while as the material for forming the nucleation surface 803, an amorphous material such as silicon nitride, aluminum oxide, etc. may be employed. Also, similarly as in the case of III-V group, without formation of a film, Se ions may be implanted into the SiO$_2$ 2 film in an excessive amount, and the modified region thus formed may be used as the nucleation surface 803.

FIG. 8A shows a substrate having a nonnucleation surface 802 with smaller nucleation density thus formed, and a nucleation surface 803 which is arranged adjacent to said nonnucleation surface 802, has an area sufficiently small for a crystal to grow only from a single nucleus 804 and has a nucleation density greater than said nonnucleation surface 802.

In the present invention, by applying a crystal forming treatment to the substrate, a single nucleus 804 is formed and a monocrystal is permitted to grow from said single nucleus. At the stage of forming said single nucleus 804, there is no problem whether the dopant may be added or not. The crystal forming treatment of the present invention has the step of crystal formation in which a starting material (Dn) for feeding a dopant for controlling to one conduction type is added to the gas phase for crystal forming treatment and the step of crystal formation in which the starting material (Dp) for feeding a dopant for controlling to the opposite conduction type is added to the above gas phase.

For example, in practicing the present invention for formation of crystals of III-V group compound semiconductor, for controlling the conduction type to p-type, the atoms of the group II of the periodic table such as Zn, Be, etc. can be used.

For controlling the conduction type to n-type, the atoms of the group IV of the periodic table such as Si, Ge, Sn, etc. or the atoms of the group VI of the periodic table such as S, Se, Te, etc. can be used as the n-type dopant.

In the case of practicing the present invention for formation of crystals of a II-VI group compound semiconductor, for controlling the conduction type to the p-type, the atoms of the group V of the periodic table such as P, N, As, etc. can be used as the p-type dopant, while for controlling to the n-type, the atoms of the group III of the periodic table such as B, Al, Ga, etc., or the atoms of the group VII of the periodic table such as F, Cl, etc. can be used as the n-type dopant. These dopants can be incorporated into the crystals by feeding the starting material (D) for feeding dopant into the gas phase for carrying out crystal forming treatment during the crystal forming treatment.

In the present invention, by feeding the starting material (Dn) for feeding the n-type dopant and the starting material (Dp) for feeding the p-type dopant into the gas phase containing the starting materials for feeding the atoms which become the matrix of the crystals to be formed, namely, the above starting materials (II) and (VI) in the case of II-VI group compound semiconductor, with switchover to one another, a semiconductor junction is formed in the crystals formed.

The starting materials (D) similarly as in the case of the starting materials (II), (VI), (III) and (V), may be suitably selected from among those which are gaseous or readily gasifiable and will not give bad influence to the crystals formed.

Specifically, the starting material (Dn) may include, for the II-VI group compound semiconductor, B$_2$H$_6$, AlR$_3$, GaR$_3$, InR$_3$, HF, Hcl and the like; for III-V group compound semiconductor, H$_2$S, SR$_2$, H$_2$Se, SeR$_2$, TeR$_2$, SiH$_4$, GeH$_4$, SnR$_4$ and the like as suitable ones. The starting material (Dp) may include, for II-VI group compound semiconductor, PH$_3$, NH$_3$, AsH$_3$, RAsH$_3$ and the like; for III-V group compound semiconductor, ZnR$_2$, BeR$_2$ and the like as suitable ones. In those formulas, R represents an alkyl group, preferably CH$_3$ or C$_2$H$_5$.

Figure 8B:
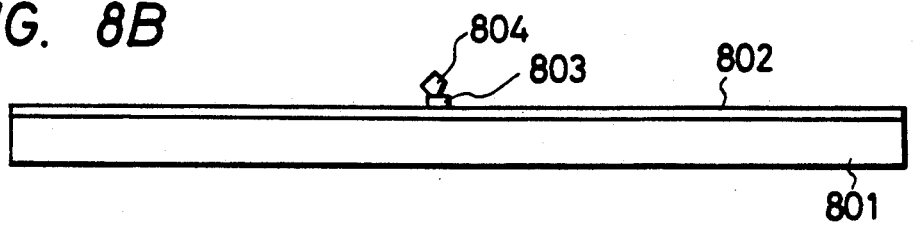
Figure 8C:
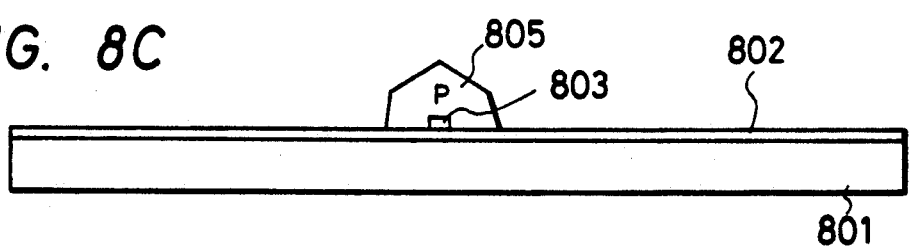

As shown in FIG. 8B, after a single nucleus 804 is formed on the nucleation surface 803, or during formation of the single nucleus, by adding a desired amount of the starting material (D) for feeding the dopant for controlling the conduction type in addition to the starting material (M) for feeding the atoms which become the matrix of the crystals formed into the gas phase for crystal forming treatment, a monocrystalline semiconductor region 805 with a desired conduction type can be formed.

For example, when a starting material (Dp) for feeding the p-type dopant is employed as the starting material (D) for feeding the dopant, the semiconductor region 805 becomes the p-type semiconductor region, while if the starting material (Dn) for feeding the n-type dopant is employed, the semiconductor region 805 becomes the n-type semiconductor region. In the figure, the semiconductor region 805 is shown as the p-type. At the stage, when the semiconductor region 805 has grown to a desired size, by switching the starting material (D) for feeding the dopant to the starting material for feeding the dopant of the conduction type different from the conduction type of the semiconductor region 805, a semiconductor region 806 different in the conduction type from the semiconductor region 805 can be formed continuously around the semiconductor region 805.

Figure 8D:
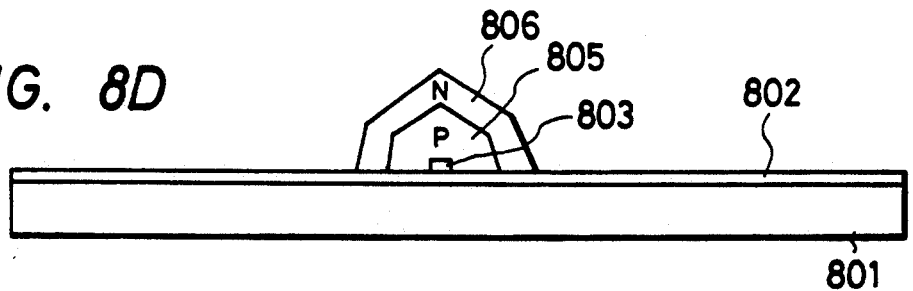

For example, when the semiconductor region 805 is the p-type, by adding a desired amount of the starting material (Dn) for feeding the n-type dopant into the gas phase for crystal forming treatment, the conduction type of the semiconductor region 807 can be made the n-type. Thus, by switching over the kind of the starting material (D) for feeding dopant at appropriate times as desired, a semiconductor junction can be formed in the monocrystal of the compound semiconductor formed. FIG. 8D shows the state in which pn junction is formed, and FIG. 8E shows the state in which pnp junction is formed.

Figure 8E:
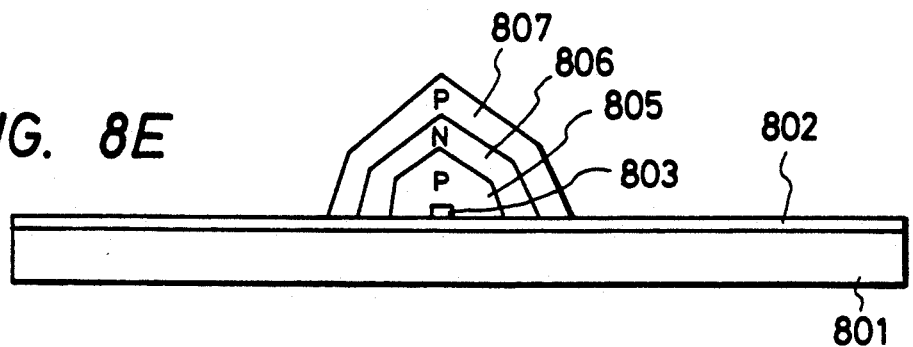
Figure 9:
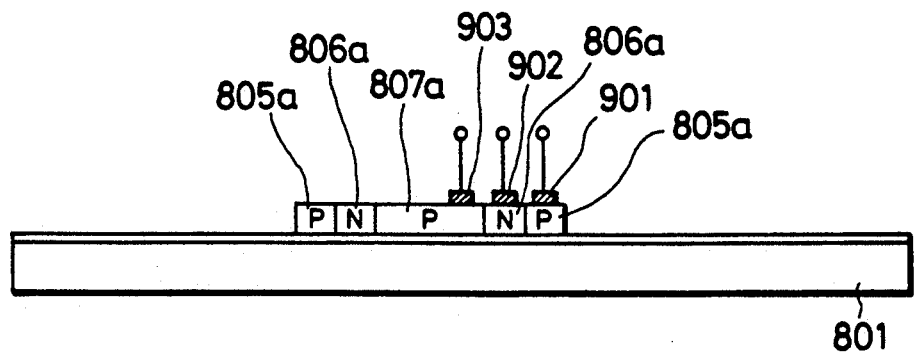
FIG. 9 illustrates the pnp junction transistor using a monocrystal obtained in accordance with the present invention.

As shown in FIG. 8E, by flattening by removing the upper portion of the monocrystal of the compound semiconductor having pnp junction formed, a semiconductor monocrystalline region having the pnp junction in the plane direction of the substrate 801 can be made on the substrate 801 as shown in FIG. 9. By providing electrodes 901, 902 and 903 on the upper surfaces of the p-type region 805a, the n-type region 806a and the p-type region 807a of the semiconductor monocrystalline region thus formed, respectively, a pnp type transistor can be obtained.

Second Embodiment

Figure 10A:
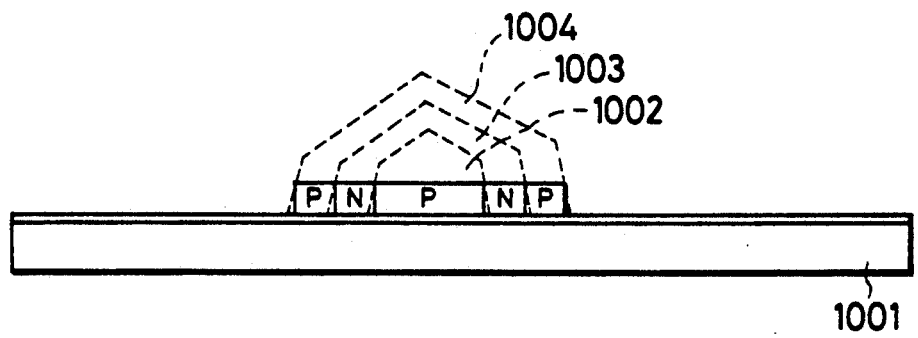
FIGS. 10A and 10B illustrate another junction type semiconductor device using a monocrystal obtained in accordance with the present invention.

Similarly as in the case of the first embodiment, after a compound semiconductor monocrystal having pnp junction is formed as shown in FIG. 8E, the upper end portion of the monocrystal is removed to be flattened similarly as in the case shown in FIG. 9 (FIG. 10A).

Figure 10B:
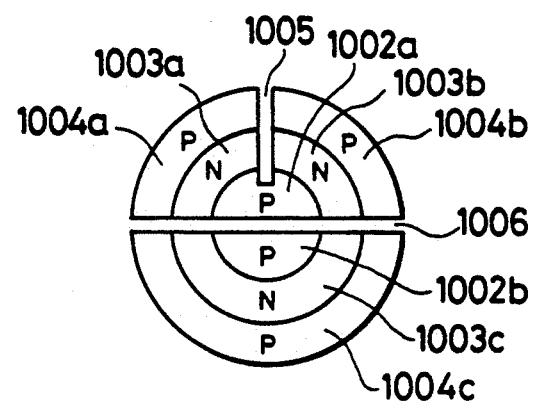

Then, by providing electrically separating regions 1005, 1006 in the vertical direction on the main surface of the substrate 1001, a semiconductor region having pnpnp junction and a semiconductor region having pnp junction are formed. Its upper plane view is shown in FIG. 10B. As shown in FIG. 10B, the semiconductor region having pnpnp junction is constituted of the p-type semiconductor region 1004a, the n-type semiconductor region 1003a, the p-type semiconductor region 1002a, the n-type semiconductor region 1003b and the p-type semiconductor region 1004b. The semiconductor region having pnp junction is constituted of the p-type semiconductor region 1002b, the n-type semiconductor region 1003c, the p-type semiconductor region 1004c.

By providing electrodes respectively on the upper plane surfaces of the semiconductor regions electrically separated similarly as in the case of FIG. 9, the semiconductor device having pnpnp junction and the semiconductor device having pnp junction can be formed at the same time on the substrate 1001.

As the method for electrical separation, there may be employed the method for cutting spatially by etching, etc. or the method in which a predetermined semiconductor region is made higher in resistance by ion implantation, etc. In the case when the compound semiconductor monocrystal is GaAs, as the ions to be implanted, Cr ions can be implanted to form partially a region with increased resistance.

The present invention is described in detail by referring to Examples.

EXAMPLE 1

FIGS. 11A–11C and FIGS. 12A–12E are diagrams showing the preparation steps of LED with GaP compound monocrystalline semiconductor.

Figure 11A:
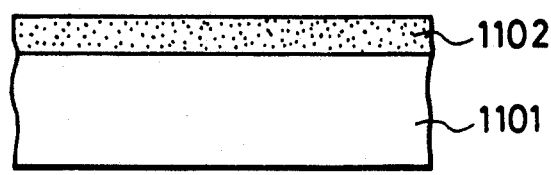
FIGS. 11A-11C and 12A-12E are diagrams of the steps of a second embodiment of the present invention.
Figure 11B:
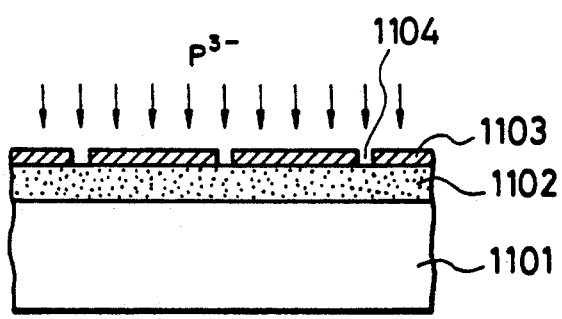
Figure 11C:
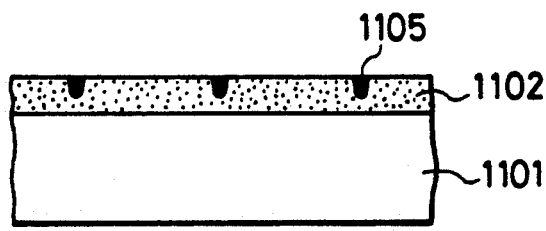

First, according to FIGS. 11A–11C, a substrate for growing a compound monocrystalline semiconductor crystal was formed.

FIG. 11A

On the surface of the glass substrate 1101, $SiO_2$ layer 1102 of about 1000Å was formed by the normal pressure CVD method by use of $SiH_4$ and $O_2$.

FIG. 11B

A photoresist layer 1103 was applied and patterning was effected so as to make a window portion 1104 of 2 $\mu m$ square (generally it may be some $\mu m$ square or less). And, by use of an ion implanter, $P^{3-}$ ions were implanted in an amount of $1 \times 10^{16}/cm^2$ onto $SiO_2$ layer 1102 (this portion becomes the nucleation surface with high nucleation density and is hereinafter called seed portion).

FIG. 11C

After the photoresist layer 1103 was peeled off, the substrate 1101 surface was subjected to heat treatment in $PCl_3$ atmosphere at 1050° C. for 10 minutes, to obtain a substrate for GaP selective nucleus growth such that the region 1105 implanted with $P^{3-}$ exists at a certain portion on $SiO_2$ layer 1102.

FIGS. 12A–12E are diagrams of steps for forming a planar type LED device region by growing continuously GaP monocrystal from p-type to n-type on the above substrate. The respective steps are as described below.

FIG. 12A

On the substrate obtained in FIG. 11C, a monocrystalline nucleus 1106 of GaP was formed by use of the MOCVD method. As the starting materials, trimethylgallium (TMG) and $PH_3$ were employed. $PH_3$ was decomposed by the hot cracking method immediately before introduction and fed into the reaction tube. The $TMG/PH_3$ molar ratio was 1.5 and the diluting gas was $H_2$. At this time, in order to make p-type, 0.02% of $(C_2H_5)_2Zn$ was mixed.

FIG. 12B

The above monocrystalline nucleus was homoepitaxially grown to form a p-type GaP semiconductor region 1106.

FIG. 12C

When p-type GaP monocrystalline region 1106 grew to a certain size, the doping gas was switched to $H_2Se$ (0.05%), to grow a n-type GaP semiconductor region 1107.

FIG. 12D

Figure 12A:
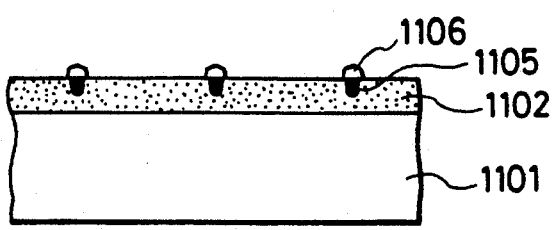
Figure 12B:
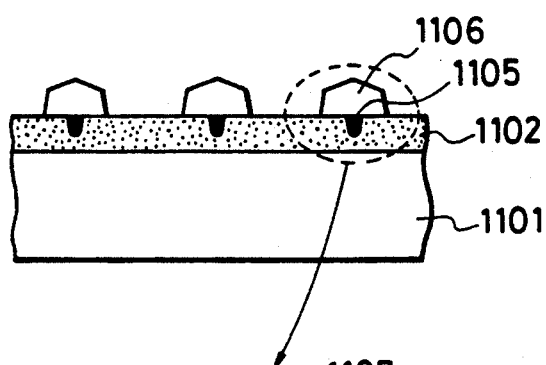
Figure 12C:
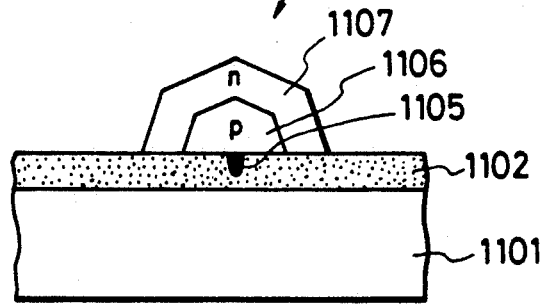
Figure 12D:
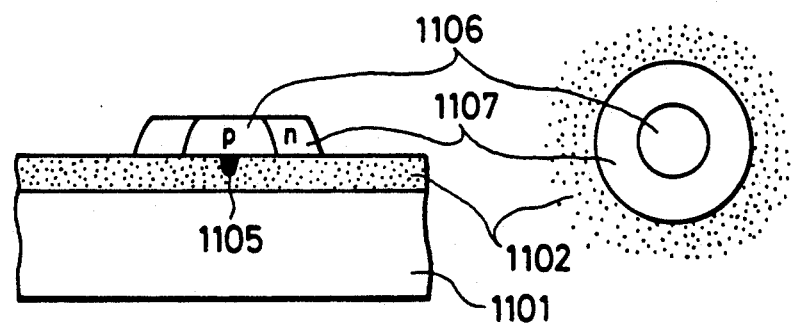
Figure 12E:
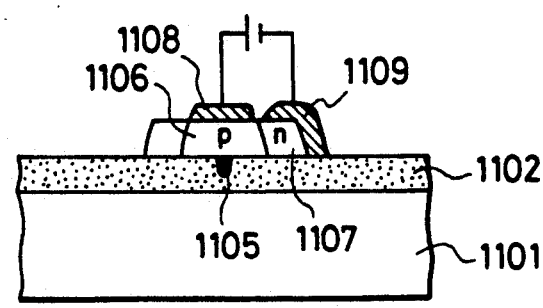

When a GaP semiconductor monocrystalline island with a double layer structure of p-type and n-type was prepared, as shown in FIG. 12D mechanical polishing was performed in parallel to the substrate so that the p-type semiconductor region 1106 was exposed to effect flattening of the upper portion of the monocrystal. On the right side of FIG. 12D there is shown the state as viewed from above the substrate.

FIG. 12E

On the flattened GaP monocrystal, electrodes were attached to form a LED device. As the electrode 1108 of the p-type region 1106, an alloy of Ag-In-Zn (8:1:1) was used, which was vapor deposited and subjected to heat treatment at 650° C. in Ar atmosphere for 5 minutes. on the other hand, as the electrode 1109 of the n-type region 1107, an alloy of Au-Ni (20:1) was used, which was vapor deposited and subjected to heat treatment at 550° C. in $H_2$ atmosphere for 2 minutes.

The LED device of GaP thus obtained exhibited a light emission spectrum having a peak near 560 nm, similarly as the GaP prepared by use of a monocrystalline wafer.

EXAMPLE 2

In this example, the seed portion (corresponding to 1105 in FIG. 11C) was formed by thin film patterning. In Example 1, the seed portion 1105 was obtained by implanting $P^{3-}$ ions into the fine portion in the crystal growth region, but in this example, the seed portion 1303 was obtained by depositing an $Al_2O_3$ thin film and further subjecting the $Al_2O_3$ film to fine patterning. The details are as described below.

(a) Similarly as in Example 1, an $SiO_2$ layer 1302 was deposited on a glass substrate 1301.

(b) Next, by use of the ion plating method, an $Al_2O_3$ film was deposited to about 300Å. That is, by means of an arc discharge type ion plating device, after evacuation to $10^{-5}$ Torr, $O_2$ gas was introduced to $1 \times 10^{-4} - 3 \times 10^{-4}$ Torr, and an $Al_2O_3$ film was deposited under the conditions of an ionization voltage 50 V (output 500 W), a substrate potential of $-50$ V, and a substrate temperature of 400° C.

Figure 13:
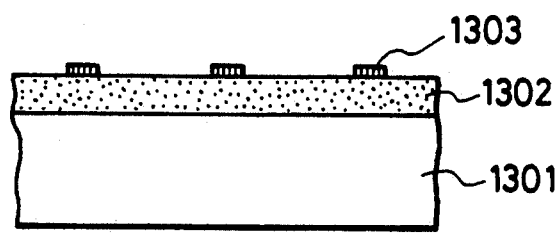
FIG. 13 illustrates the substrate for crystal formation used in the present invention.

(c) As shown in FIG. 13, the $Al_2O_3$ film was subjected to patterning to 2 μm by use of the photolithographic technique to form the seed portion 1303. The etchant was $H_3PO_4:HNO_3:CH_3COOH:H_2O = 16:1:2:1$ (40° C.).

(d) After the photoresist was peeled off, an LED of GaP was prepared by employing the same steps as in Example 1. The LED device obtained exhibited light emission having a peak at around 560 nm similarly as in Example 1.

EXAMPLE 3

In this example, GaAs was grown. Also for GaAs, TMG and $AsH_3$ were used as the starting gases, and p-type and n-type could be freely controlled by use of Si as the n-type dopant and Be as the p-type dopant similarly as in growth of GaP.

EXAMPLE 4

Figure 14A:
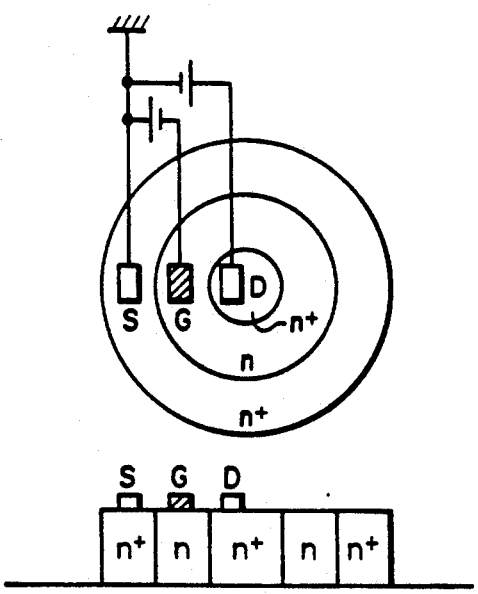
FIGS. 14A and 14B illustrate another semiconductor device using a monocrystal obtained in accordance with the present invention.
Figure 14B:
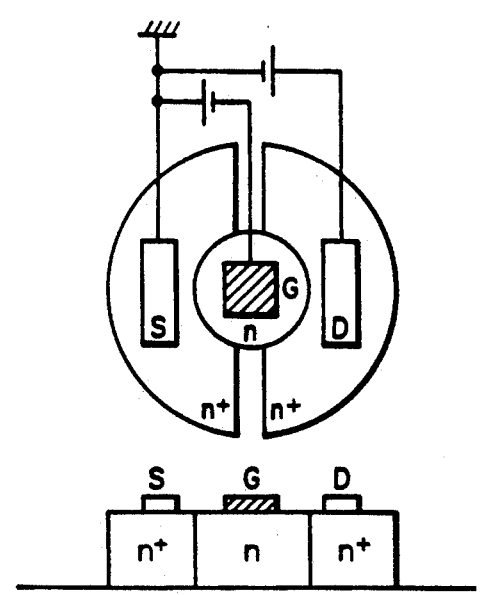

In this example, a MES type FET as shown in FIGS. 14A, 14B was formed. In the MES type FET shown in FIG. 14A, a three-layer structure was formed in the order of n+, n, n+ and electrodes were attached as shown in FIG. 14A after mechanical flattening. In the MES type FET shown in FIG. 14B, a double layer structure was formed in the order of n+, n and, after mechanical flattening, the n+ region was separated into two insulated parts, followed by attachment of the electrodes as shown in FIG. 14B. In FIGS. 14A, 14B, G represents Schottky gate electrode, S source electrode and D drain electrode. The compound semiconductor monocrystal used was Gap.

EXAMPLE 5

Figure 15A:
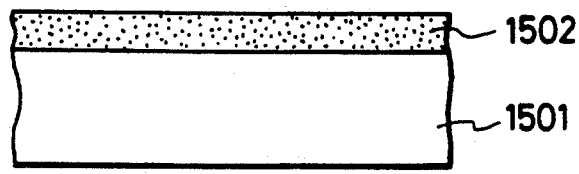
FIGS. 15A-15J are diagrams of the formation steps of the LED device in one example of the present invention.
Figure 15B:
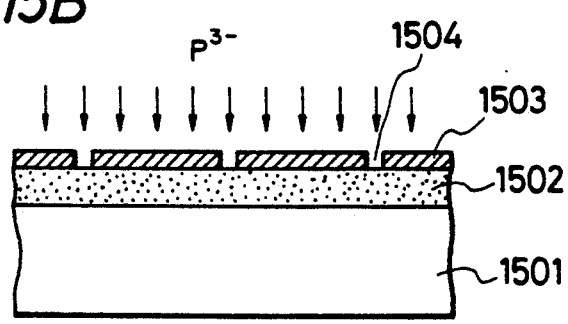
Figure 15C:
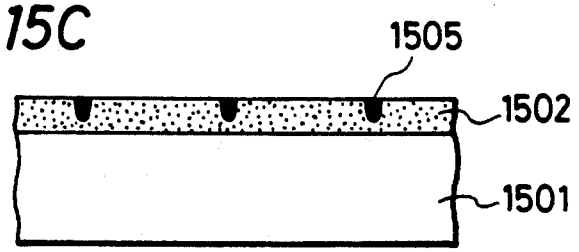
Figure 15D:
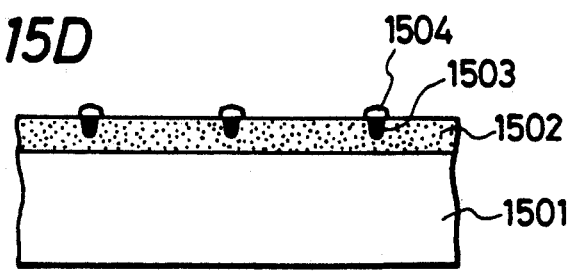

FIGS. 15A–FIG. 15J are preparation steps showing an example of GaP light emission diode.
FIG. 15A On the surface of the substrate 1501, $SiO_2$ layer 1502 of about 1000Å thickness was deposited by the CVD method by use of $SiH_4$ and $O_2$. The sputtering method may be used in place of the CVD method.
FIG. 15B Patterning was effected with a photoresist film provided on the $SiO_2$ layer 1502, followed by masking with the window portion of 1 μm² being remained. And, by use of an ion implanter, $P^{3-}$ ions were implanted in an amount of $1 \times 10^{16}/cm^2$ into the $SiO_2$ layer 1502.
FIG. 15C At the portion of the $SiO_2$ layer 1502 corresponding to the window portion of the photoresist, a seed portion 1503 implanted with P ions was formed.
FIG. 15D In a $PCl_3$ atmosphere, heat treatment was performed at 900° C. for 10 minutes, and then a p-type semiconductor monocrystalline island 1504 of GaP was grown by use of the MOCVD method. As the starting materials, trimethylgallium (TMG) and $PH_3$ were employed. $PH_3$ was decomposed by the hot cracking method immediately before introduction and fed into the reaction tube. The molar ratio of TMG to $PH_3$ was 2:1 and the diluting gas was $H_2$. The reaction pressure was normal, and the substrate temperature was 850° C.

Figure 15E:
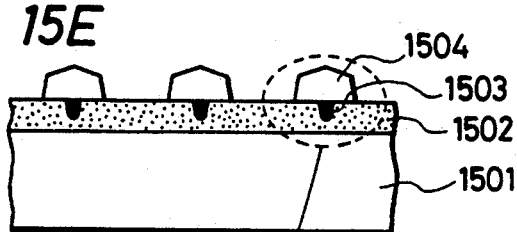
Figure 15F:
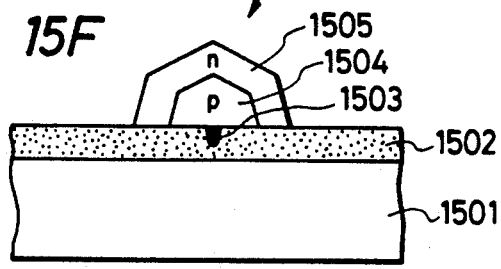
Figure 15G:
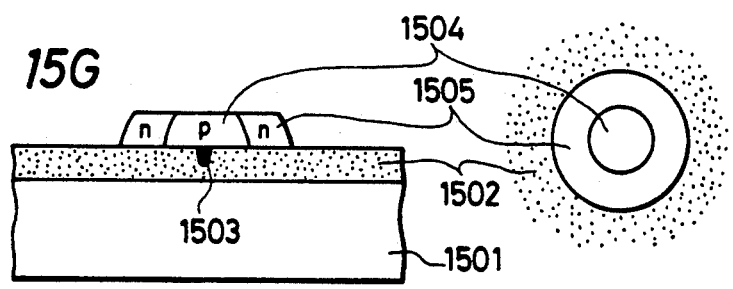
Figure 15H:
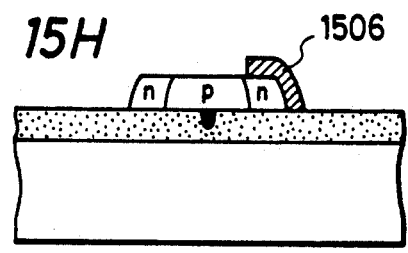
Figure 15I:
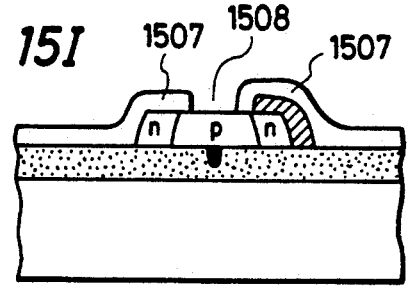
Figure 15J:
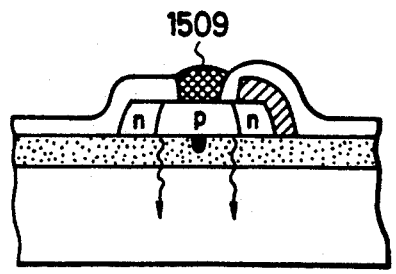

In the starting material for feeding the p-type dopant, 0.02% of diethylzinc (DEZn) was mixed.
FIG. 15E and FIG. 15F When the p-type GaP 1504 grew to a desired size, the doping gas was changed from DEZn to selenium hydride ($H_2Se$) to grow n-type GaP 1505. $H_2Se$ was mixed to 0.05%.
FIG. 15G The upper portion of the monocrystalline islands 1504, 1506 were flattened by mechanical polishing.
FIG. 15H After preparation of a negative pattern with a resist, Au-Ni (20:1) was vapor deposited to 3000Å. The resist was dissolved by use of a solvent to lift off unnecessary portions, thereby forming an n-side electrode 1506. Further, the electrode was heated in $H_2$ atmosphere at 550° C. for 2 minutes.
FIG. 15I An $SiO_2$ film 1507 was deposited to 4000Å by the sputtering method, and a contact hole 1508 to the n-layer was formed by use of the photolithographic technique.
FIG. 15J Ag-In-Zn (8:1:1) was deposited to 6000Å by vapor deposition, subjected to patterning with a photoresist and then a p-side electrode 1509 was formed according to the dry etching method by use of $CCl_2F_2$. Further, the electrode was heated in Ar atmosphere at 650° C. for 5 minutes. Thus, a LED device was prepared.

When a transparent material such as $SiO_2$ 2 is used as the substrate 1501, light emission occurs from the bottom of the device through the substrate 1501. On the contrary, when the substrate 1501 is opaque as alumina, by making the electrodes 1506, 1509 except for the contact portions transparent electrodes such as of ITO, light emission can be effected from the direction before of the substrate 1501 (upper part in the drawing).

EXAMPLE 6

Figure 16A:
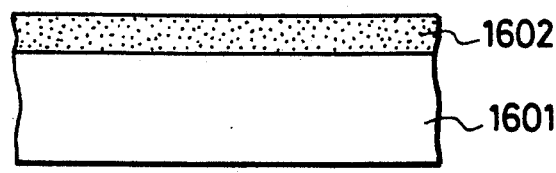
FIGS. 16A-16I are diagrams of the formation steps of the LED device in another example of the present invention.
Figure 16B:
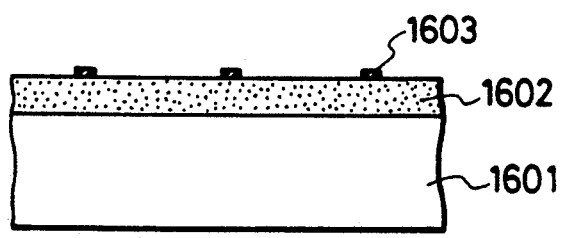
Figure 16C:
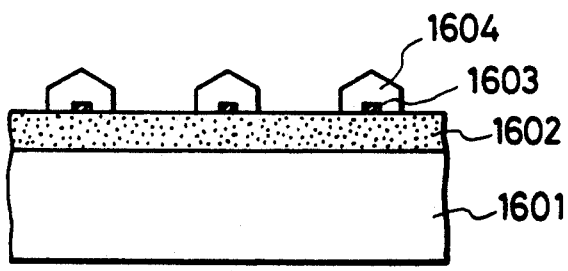
Figure 16D:
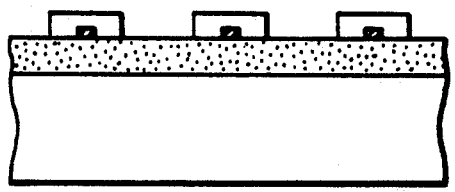

FIGS. 16A–FIG. 16I are diagrams of the steps for preparation of a GaN light emission diode which is one of MIS type LED. The respective steps are described below.
FIG. 16A An $SiO_2$ film 1602 was deposited to about 1000Å on the surface of the substrate 1601 according to the CVD method by use of $SiH_4$ and $O_2$.
FIG. 16B Next, by use of the ion plating method, an $Al_2O_3$ film was deposited to 300Å. That is, by means of an arc discharge type ion plating device, after evacuation to $10^{-5}$ Torr, $O_2$ gas was introduced to $1-3\times 10^{-4}$ Torr, and $Al_2O_3$ was deposited under the conditions of an ionization voltage 50 V (output 500 W), a substrate potential of $-50$ V, and a substrate temperature of 400° C. Then, resist patterning, and followed by patterning to 1.5 μm with an etchant ($H_3PO_4$:$HNO_3$:$CH_3COOH$:$H_2O$=16:1:2:1, 40° C.) were effected, thereby forming a seed portion 1603 of $Al_2O_3$.

FIG. 16C

In $PCl_3$ atmosphere, heat treatment was conducted at 950° C. for 10 minutes, and then a monocrystalline island 1604 of n-type GaN was grown by the MOCVD method. As the starting gases, trimethylgallium (TMG) and ammonia ($NH_3$) were employed, with the $TMG/NH_3$ molar ratio being made 120, and the diluting gas $H_2$. The reaction pressure was made normal, and the substrate temperature 1000° C.

FIG. 16D

The grown monocrystalline island 1604 of GaN was flattened by mechanical polishing.

Figure 16E:
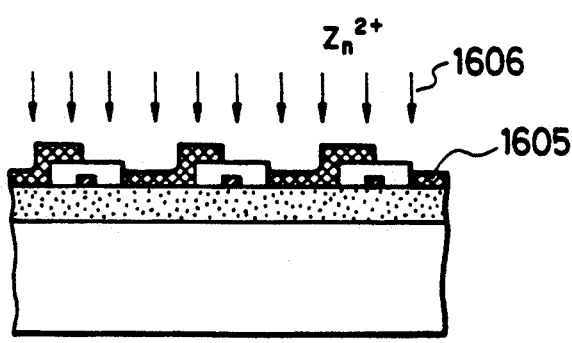
Figure 16F:
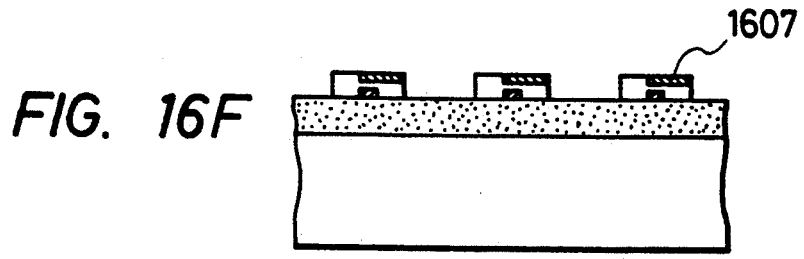
Figure 16G:
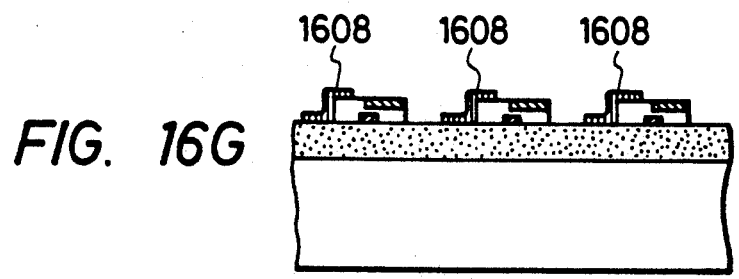

FIG. 16E and FIG. 16F

After patterning with a photoresist 1605, $Zn^{2+}$ ions 1606 were implanted in an amount of $1\times 10^{16}/cm^2$, and heated in $H_2$ atmosphere at 900° C. for 5 minutes to form an insulating layer 1607 (high resistance GaN layer).

FIG. 16G

After preparation of a negative pattern with a resist, In-Al was vapor deposited to 2000Å. Next, the resist was dissolved to lift off unnecessary portions, thereby forming an electrode 1608.

Figure 16H:
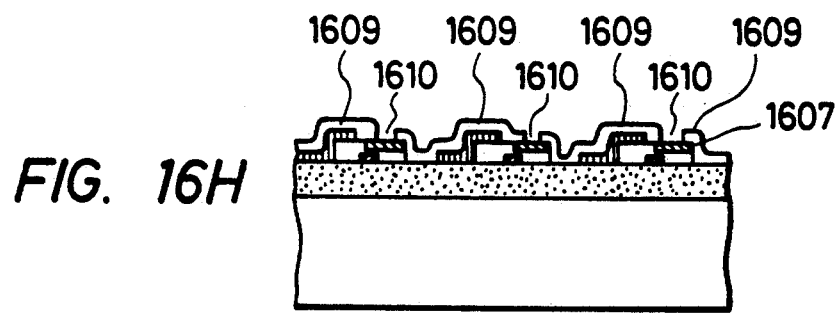
Figure 16I:
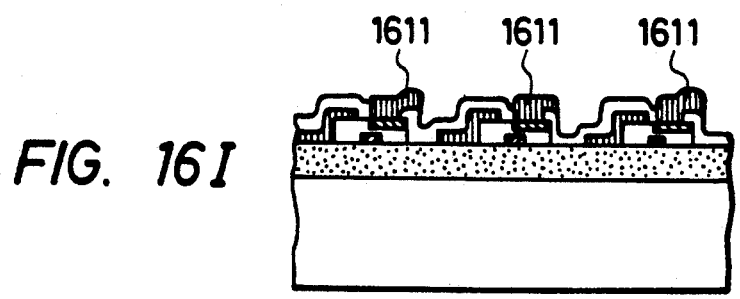

FIG. 16H $SiO_2$ was deposited to 3000 Å by the sputtering method, and a contact hole 1610 to the insulating layer 1607 was formed by use of the photolithographic technique.

FIG. 16I

In-Al was vapor deposited to 5000Å, followed by patterning to form an electrode 1611 on the insulating layer 1607 side. As the etchant, $FeCl_3$:$HCl$:$H_2O$=2:3:10 was employed. When the MIS type LED of GaN, thus prepared was subjected to light emission actuation, good emission characteristics were exhibited.

The selective nucleation LED preparation steps of GaP, GaN as described above can be practiced not only by the above MOCVD method, but also by the MBE method and the LPE method. Also, they are applicable also for other compound semiconductor materials other than GaP and GaN.

Figure 17:
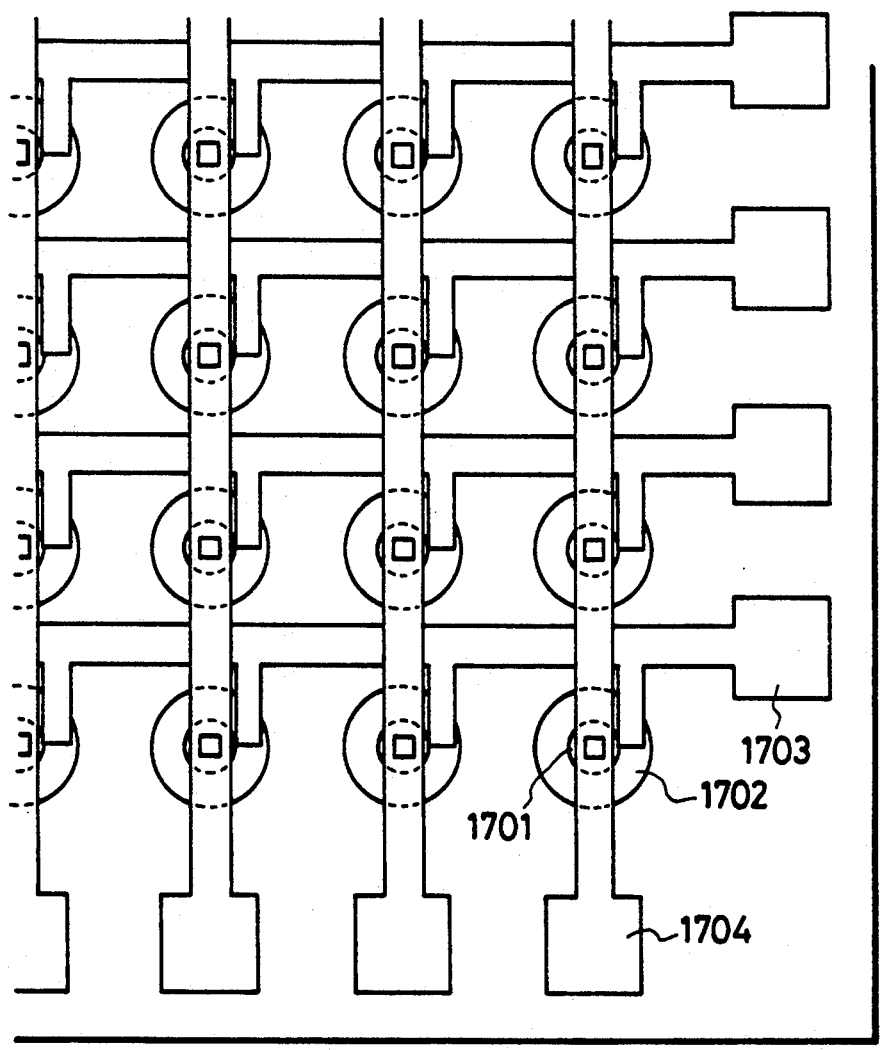
FIG. 17 illustrates the X-Y matrix two-dimensional planar LED device using a monocrystal obtained by the present invention.
Figure 18A:
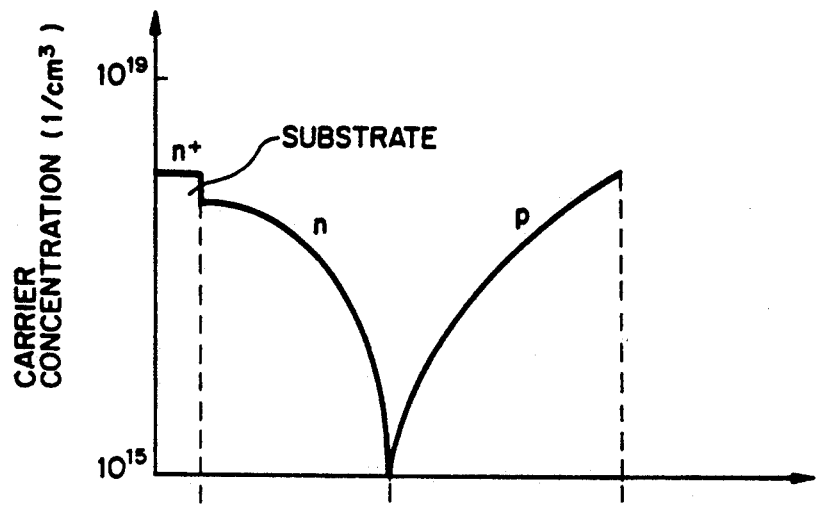
FIG. 18A shows the carrier concentration distribution near the pn junction of a compound semiconductor formed by the above prior art method and FIG. 18B shows the change in carrier concentration corresponding to the relationship between solution temperature and time.
Figure 18B:
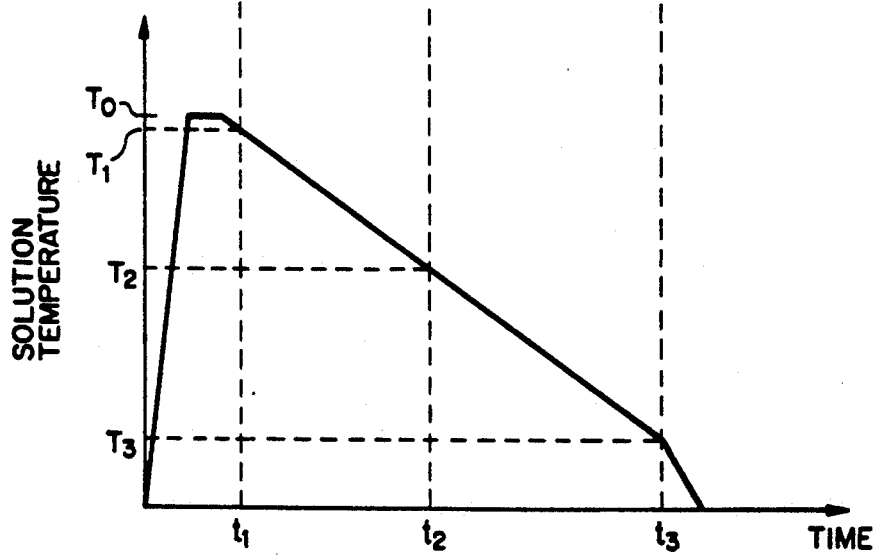

FIG. 17 is a plane view of a LED array comprising a plural number of the p-n junction type LED as previously explained as Example 5 arranged on a single substrate. 1701 shown in this Figure is a n-type GaP crystal, 1702 a p-type GaP crystal, 1703 and 1704 are electrodes (see FIGS. 15G–FIG. 15J).

Also, it is possible to form an LED array by use of the MIS type LED explained as Example 6 other than the p-n junction type LED.

Further, by arranging LED's having a plural number of emission colors within the LED array, for example, by arranging LED's of R, G and B emission, a color image displayer can be also constituted. Here, it is suitable to use GaAsP as the R (red color) emitting LED, GaP as the G (green color) emitting LED and GaN as the B (blue color) emitting LED.

As described above, according to the present invention, enlargement of area and low cost of the substrate can be realized by the technique for building up selectively a compound semiconductor crystal in shape of islands at any desired position of any desired substrate. Also, the pn junction face obtained by practicing the present invention is exposed as positioned in the direction approximately vertical to the substrate surface, and therefore the steps of device formation can be simplified by reducing the number of photopatterning during device formation.

The effects of the present invention may be more specifically enumerated as follows.

1) Because of selective nucleus growth on any desired substrate, the substrate is not limited to expensive compound semiconductor substrates.

2) Because a crystal can be grown only on the desired position, it is possible to completely effect insulating separation mutually between the devices during formation of devices.

3) Since the pn junction face obtained by practicing the present invention is not in parallel to the substrate but exposed in the direction vertical thereto, the photoetching steps, etc. during device formation can be omitted to a great extent.

As another effect, a LED device can be easily prepared on any desired base substrate at any desired position.

By doing so, a large-scale display device which is hitherto prepared by hybridization of a large number of LED devices can be easily prepared as the monolithic constitution.

Also, it becomes possible to prepare a one-dimensional light source or two-dimensional (plane emission) light source by a LED array with monolithic constitution.

Further, according to the present invention, since it becomes also possible to form LED on a substrate such as ceramics, etc., reduction of production cost can be effected.

We claim:

1. A semiconductor device employing a compound semiconductor obtained by a process for producing a compound semiconductor, which comprises applying a crystal forming treatment on a substrate having a free surface comprising a non-nucleation surface ($S_{NDS}$) with a smaller nucleation density and an amorphous nucleation surface ($S_{NDL}$) arranged adjacent thereto having a sufficiently small area so as to form a single nucleus from with a single crystal is grown and a larger nucleation density ($ND_L$) than the nucleation density ($ND_S$) of said non-nucleation surface ($S_{NDS}$), so as to form only a single nucleus from which a single crystal is grown, by exposing the substrate to either of the gas phases:

(a) gas phase (a) containing a starting material (II) for feeding the group II atoms of the periodic table and a starting material (VI) for feeding the group VI atoms of the periodic table; and (b) gas phase (b) containing a starting material (III) for feeding the group III atoms of the periodic table and a starting material (V) for feeding the group V atoms of the periodic table, thereby forming a single nucleus on said nucleation surface ($S_{NDL}$) and permitting a monocrystal of the compound semiconductor to grow only from said single nucleus, characterized in that a semiconductor junction is formed in said monocrystal by feeding a starting material (Dn) for feeding a dopant for controlling to a first electroconduction type and a starting material (Dp) for feeding a dopant for controlling to a second electroconduction type opposite to said first electroconduction type with change-over to one another into said gas phase, during said crystal forming treatment, said semiconductor junction intersection both the free surface of said substrate and a free surface of said compound semiconductor opposite to the free surface of said substrate.

2. The semiconductor device according to claim 1 wherein said semiconductor device is a light emission display device.

3. A light emitting device comprising a substrate having a plurality of nucleation surfaces and a non-nucleation surface and a plurality of bodies made of a II-VI group compound semiconductor single-crystal material, each of which bodies has a surface contiguous to said substrate, an opposite surface and a semiconductor junction for emitting light, said junction intersecting said surfaces being contiguous to said substrate and said opposite surface.

4. A light emitting device comprising a substrate having a plurality of nucleation surfaces and a non-nucleation surface and a plurality of bodies made of a III-V group compound semiconductor single-crystal material, each of which bodies has a surface contiguous to said substrate, an opposite surface and a semiconductor junction for emitting light, said junction intersecting said surfaces being contiguous to said substrate and said opposite surface.

* * * * *

UNITED STATES PATENT AND TRADEMARK OFFICE
CERTIFICATE OF CORRECTION

PATENT NO. : 5,304,820
DATED : April 19, 1994
INVENTOR(S) : HIROYUKI TOKUNAGA, ET AL.

It is certified that error appears in the above-identified patent and that said Letters Patent is hereby corrected as shown below:

COLUMN 6

Line 4, "(nonnuclea-" should read --[nonnuclea- --.
Line 55, "course" should read --course,--.
Line 56, "FIGS. 5A-5D" should read --FIGS. 5A-5D,--.

COLUMN 7

Line 44, "13A-YA" should read --13A-1,--.

COLUMN 9

Line 11, "embodiment" should read --Embodiment--.

COLUMN 12

Line 63, "on" should read --On--.

COLUMN 13

Line 54, "Gap." should read --GaP.--.
Line 68, "being remained." should read --remaining.--.

COLUMN 16

Line 47, "with" should read --which--.

UNITED STATES PATENT AND TRADEMARK OFFICE
CERTIFICATE OF CORRECTION

PATENT NO. : 5,304,820
DATED : April 19, 1994
INVENTOR(S) : HIROYUKI TOKUNAGA, ET AL.

It is certified that error appears in the above-identified patent and that said Letters Patent is hereby corrected as shown below:

<u>COLUMN 17</u>

Line 5, "intersection" should read --intersecting--.

Signed and Sealed this

Sixth Day of December, 1994

Attest:

BRUCE LEHMAN

Attesting Officer     Commissioner of Patents and Trademarks